United States Patent
Jeon et al.

(10) Patent No.: US 7,928,439 B2
(45) Date of Patent: Apr. 19, 2011

(54) THIN FILM TRANSISTOR, ORGANIC LIGHT EMITTING DISPLAY DEVICE INCLUDING THE SAME, AND METHOD OF MANUFACTURING THE ORGANIC LIGHT EMITTING DISPLAY DEVICE

(75) Inventors: Hee-Chul Jeon, Suwon-si (KR); Chul-Kyu Kang, Suwon-si (KR); Woo-Sik Jun, Suwon-si (KR); Jong-Hyun Choi, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 106 days.

(21) Appl. No.: 12/149,580

(22) Filed: May 5, 2008

(65) Prior Publication Data
US 2008/0277666 A1    Nov. 13, 2008

(30) Foreign Application Priority Data
May 11, 2007    (KR) .................. 10-2007-0046226

(51) Int. Cl.
*H01L 29/04* (2006.01)
(52) U.S. Cl. .............. 257/59; 257/72; 257/83; 257/257; 257/290; 257/E31.083
(58) Field of Classification Search .............. 257/59, 257/72, 83, 257, 290
See application file for complete search history.

(56) References Cited

U.S. PATENT DOCUMENTS

| | | | |
|---|---|---|---|
| 5,920,082 A | 7/1999 | Kitazawa et al. | |
| 6,713,825 B2 | 3/2004 | Hwang | |
| 6,998,641 B2 | 2/2006 | Makita et al. | |
| 2004/0018669 A1* | 1/2004 | Song | 438/151 |
| 2006/0050190 A1* | 3/2006 | Song | 349/38 |
| 2007/0045556 A1* | 3/2007 | Watanabe et al. | 250/370.14 |
| 2008/0315201 A1* | 12/2008 | Ohmi et al. | 257/59 |

FOREIGN PATENT DOCUMENTS

| | | |
|---|---|---|
| JP | 2003-017500 | 1/2003 |
| KR | 10-1997-0022459 A | 5/1997 |
| KR | 10-2003-0057074 A | 7/2003 |

* cited by examiner

*Primary Examiner* — Wai-Sing Louie
(74) *Attorney, Agent, or Firm* — Lee & Morse, P.C.

(57) ABSTRACT

A thin film transistor (TFT) may include a substrate, a gate electrode on the substrate, a gate insulating layer on the gate electrode, and a semiconductor layer on the gate insulating layer. The semiconductor layer may include a top surface, a channel area aligned in a vertical direction with the gate electrode, a plurality of doped areas proximate to the channel area, and a plurality of non-doped areas. Source and drain electrodes may be on the top surface of the semiconductor layer aligned above respective ones of the plurality of non-doped areas of the semiconductor layer. A planarization layer may be on the gate insulating layer, the source and drain electrodes and the semiconductor layer channel area, and may include a plurality of openings respectively exposing the plurality of doped areas of the semiconductor layer and a portion of the source electrode and the drain electrode.

21 Claims, 7 Drawing Sheets

THIN FILM TRANSISTOR, ORGANIC LIGHT EMITTING DISPLAY DEVICE INCLUDING THE SAME, AND METHOD OF MANUFACTURING THE ORGANIC LIGHT EMITTING DISPLAY DEVICE

BACKGROUND OF THE INVENTION

1. Field of the Invention

Embodiments of the present invention relate to a thin film transistor, an organic light emitting display device including the same, and a method of manufacturing the organic light emitting display device. More particularly, embodiments relate to a thin film transistor having a low contact resistance, an organic light emitting display device including the same, and a method of manufacturing the organic light emitting display device that may include a reduced number of processing steps.

2. Description of the Related Art

In general, thin film transistors are employed as switching devices or as driving devices for flat panel display devices, such as liquid crystal display (LCD) devices and organic light emitting diode (OLED) display devices. Thin film transistors are classified into top gate type thin film transistors and bottom gate type thin film transistors, according to the location of a gate electrode. In general, top gate type thin film transistors are used in flat panel display devices, such as OLED display devices.

Manufacturing an OLED display device including a top gate type thin film transistor is typically process intensive, and involves numerous complex and expensive process steps. In particular, numerous masks in may be required, with each mask using process needing coating, exposing, and developing processes. As a result, a continuing need exists to address one or more of these limitations of the conventional art.

SUMMARY OF THE INVENTION

Embodiments are therefore directed to a thin film transistor (TFT), an organic light emitting display device including the same, and a method of forming an organic light emitting display device including the same.

It is therefore a feature of an embodiment of the present invention to provide a TFT that may be formed by a reduced number of processing steps.

It is therefore another feature of an embodiment of the present invention to provide an organic light emitting display device including a TFT that may be formed by a reduced number of processing steps.

It is therefore another feature of an embodiment of the present invention to provide a method of forming a TFT by employing a reduced number of processing steps.

At least one of the above and other features of the present invention may be realized by providing a thin film transistor (TFT), including a substrate, a gate electrode on the substrate, a gate insulating layer on the gate electrode, a semiconductor layer on the gate insulating layer, the semiconductor layer including a top surface, a channel area aligned in a vertical direction with the gate electrode, a plurality of doped areas proximate to the channel area, and a plurality of non-doped areas, each non-doped area proximate to at least one of the plurality of doped areas, a source electrode on the top surface of the semiconductor layer aligned above one of the plurality of non-doped areas of the semiconductor layer, a drain electrode on the top surface of the semiconductor layer aligned above another one of the plurality of non-doped areas of the semiconductor layer, and a planarization layer on the gate insulating layer, the source and drain electrodes and the semiconductor layer channel area, the planarization layer including a plurality of openings respectively exposing the plurality of doped areas of the semiconductor layer and exposing a portion of the source electrode and the drain electrode.

The TFT may further include a conductive layer in one of the plurality of planarization layer openings and in contact with at least one of the plurality of doped areas of the semiconductor layer and at least one of the source electrode and the drain electrode, and a pixel electrode in another one of the plurality of planarization layer openings and extending to a top surface of the planarization layer, the pixel electrode in contact with at least one other of the plurality of doped areas of the semiconductor layer and at least one other of the source electrode and the drain electrode. Further, the conductive layer and the pixel electrode may be formed of the same material.

The conductive layer and the pixel electrode may be formed of the same material as the source electrode and the drain electrode. Further, the semiconductor layer may include a first end portion and a second end portion patterned such that the first end portion and the second end portion of the semiconductor layer are aligned in the vertical direction with an end portion of the source electrode and an end portion of the drain electrode, respectively.

The semiconductor layer may include a polycrystalline silicon. Further, the substrate may include glass.

At least one other of the above and other features of the present invention may be realized by providing an organic light emitting diode (OLED) display device, including a substrate, a gate electrode on the substrate, a gate insulating layer on the gate electrode, a semiconductor layer on the gate insulating layer, the semiconductor layer including a top surface, a channel area aligned in a vertical direction with the gate electrode, a plurality of doped areas proximate to the channel area, and a plurality of non-doped areas, each non-doped area proximate to at least one of the plurality of doped areas, a source electrode on the top surface of the semiconductor layer aligned above one of the plurality of non-doped areas of the semiconductor layer, a drain electrode the top surface of the semiconductor layer aligned above another one of the plurality of non-doped areas of the semiconductor layer, a planarization layer on the gate insulating layer, the source and drain electrodes and the semiconductor layer channel area, the planarization layer including a plurality of openings respectively exposing the plurality of doped areas of the semiconductor layer and exposing a portion of the source electrode and the drain electrode, a conductive layer in one of the plurality of planarization layer openings and in contact with at least one of the plurality of doped areas of the semiconductor layer and at least one of the source electrode and the drain electrode, a pixel electrode in another one of the plurality of planarization layer openings and extending to a top surface of the planarization layer, the pixel electrode in contact with at least one other of the plurality of doped areas of the semiconductor layer and at least one other of the source electrode and the drain electrode, a pixel defining layer on the planarization layer and the pixel electrode and exposing a portion of the pixel electrode, an organic emission layer on the exposed portion of the pixel electrode, and an opposite electrode on the organic emission layer.

The conductive layer and the pixel electrode may be formed of the same material. Further, the conductive layer and the pixel electrode may be formed of the same material as the source electrode and the drain electrode.

The semiconductor layer may include a first end portion and a second end portion patterned such that the first end portion and the second end portion of the semiconductor layer are aligned in the vertical direction with an end portion of the source electrode and an end portion of the drain electrode, respectively.

The OLED may further include a spacer on the pixel defining layer. The pixel defining layer and the spacer may be formed of the same material. Further, the pixel defining layer and the spacer may be formed of a polyimide. The OLED may further include a buffer layer on the substrate.

At least one other of the above and other features of the present invention may be realized by providing a method of manufacturing an organic light emitting diode (OLED) display device, the method including forming a gate electrode on a substrate, depositing a gate insulating layer on the substrate and the gate electrode, depositing an amorphous silicon layer on the gate insulating layer, crystallizing the amorphous silicon layer to form a polycrystalline silicon layer, depositing a conductive material on the polycrystalline silicon layer, simultaneously patterning the polycrystalline silicon layer and the conductive material to form a semiconductor layer from the polycrystalline silicon layer and source and drain electrodes from the conductive material, the semiconductor layer having an exposed portion between the source and drain electrodes, forming a planarization layer on the gate insulating layer, the exposed portion of the semiconductor layer and the source and drain electrodes, and forming an opening in the planarization layer to expose a sub-portion of the exposed portion of the semiconductor layer and a portion of the source and drain electrodes.

The method of manufacturing an organic light emitting diode (OLED) display device may further include doping the exposed sub-portion of the semiconductor layer with an impurity to form a first doped sub-portion and a second doped sub-portion, depositing a conductive material in the planarization layer opening, on a portion of the planarization layer, on a portion of the source and drain electrodes and on the first and the second doped sub-portions of the semiconductor layer, patterning a portion of the conductive material deposited in the opening to form a conductive layer in contact with the first doped sub-portion of the semiconductor layer and one of the source and the drain electrode, patterning another portion of the conductive material to form a pixel electrode in contact with the second doped sub-portion of the semiconductor layer and one other of the source and the drain electrode, forming a pixel defining layer on the pixel electrode, patterning the pixel defining layer to expose a portion of the pixel electrode, and forming an organic emission layer and an opposite electrode on the pixel defining layer.

A spacer may be formed on the pixel defining layer prior to patterning the pixel defining layer. The polycrystalline silicon layer and the conductive material may be simultaneously patterned by using a half-tone mask. Further, the pixel defining layer and the spacer may be simultaneously patterned by using a half-tone mask.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2007-0046226, filed on May 11, 2007, in the Korean Intellectual Property Office, and entitled: "Thin Film Transistor, Organic Light Emitting Display Device Including the Same, and Method of Manufacturing the Organic Light Emitting Display Device," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
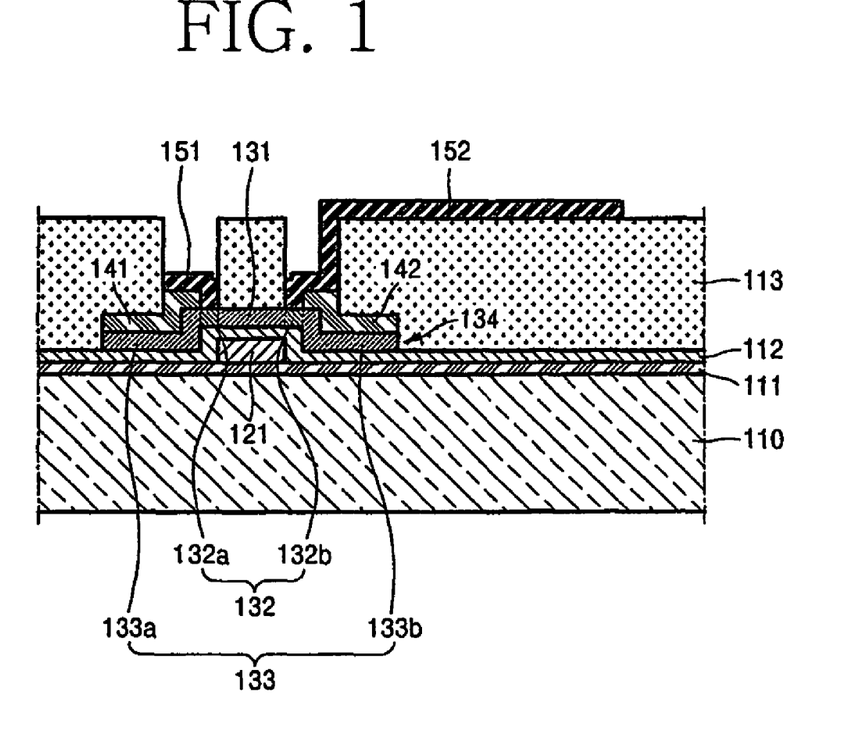
FIG. 1 illustrates a schematic sectional view of a thin film transistor according to an embodiment of the present invention.

FIG. 1 illustrates a schematic sectional view of a bottom gate-type thin film transistor according to an embodiment of the present invention. In FIG. 1, the thin film transistor includes a substrate 110, a buffer layer 111 on the substrate 110, and a gate electrode 121 on the buffer layer 111. A gate insulating layer 112 may be on the gate electrode 121 and/or the buffer layer 111. A semiconductor layer 134 may be on the gate insulation layer 112. Source and drain electrodes 141 and 142 may be on the semiconductor layer 134. The semiconductor layer 134 may include a channel area 131, which may be aligned in a vertical direction with the gate electrode 121, for example. Further, the semiconductor layer 134 may include non-doped portions 133, including first non-doped portion 133a and second non-doped portion 133b. First non-doped portion 133a and second non-doped portion 133b may contact the source and drain electrodes 141 and 142, respectively. Doped portions 132, including first doped portion 132a and second doped portion 132b, may be respectively between non-doped portions 133a and 133b and channel area 131. The first doped portion 132a and the second doped portion 132b may also contact the source electrode 141 and the drain electrode 142, respectively, although the scope of the present invention is not so limited.

A planarization layer 113 may be on one or more of the gate insulating layer 112, the semiconductor layer 134 and the source and drain electrodes 141 and 142. A conductive layer 151 may be on the semiconductor layer 134 and the source electrode 142. A pixel electrode 152 may be on the semiconductor layer 134 and the drain electrode 142. The pixel electrode 152 may extend to and may be on a top surface of the planarization layer 113.

The substrate 110 may be a glass substrate formed of silicon dioxide ($SiO_2$). The substrate 110 may alternatively be formed from other materials, such as a plastic material. The buffer layer 111 may be formed on the substrate 110 in order to planarize the substrate 110 and to prevent permeation of impurities into the substrate 110. The buffer layer may be formed of, e.g., $SiO_2$ and/or SiNx deposited by plasma enhanced chemical vapor deposition (PECVD), atmospheric pressure chemical vapor deposition (APCVD), low pressure chemical vapor deposition (LPCVD), or the like.

The thin film transistor illustrated in FIG. 1 may be employed in a display device, including an organic light emitting diode (OLED) display device, a liquid crystal display (LCD) device, and so forth. Further, the thin film transistor illustrated in FIG. 1 may undergo additional processing to form additional elements thereon. For example, if the thin film transistor illustrated in FIG. 1 is to be employed in an OLED display device, additional processing steps may result in the addition of further elements as illustrated in FIG. 2.

Figure 2:
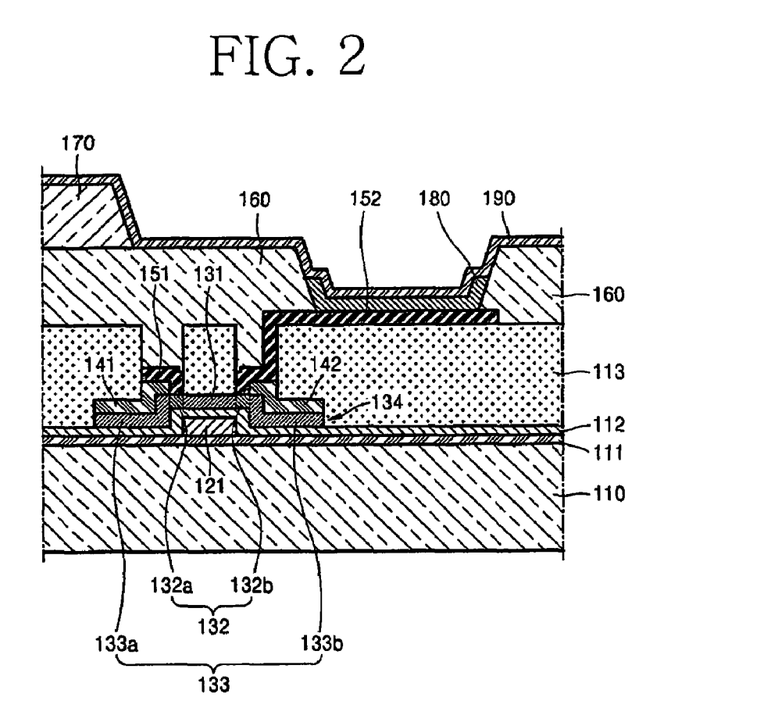
FIG. 2 illustrates a schematic sectional view of an organic light emitting display device including a thin film transistor, according to an embodiment.

Referring to FIG. 2, an OLED display device including the thin film transistor illustrated in FIG. 1 is illustrated. The OLED display device according to an embodiment may include the substrate 110, the buffer layer 111, the gate electrode 121, the gate insulating layer 112, the channel area 131, the non-doped portions 133, including the first non-doped portion 133a and the second non-doped portion 133b, doped portions 132, including the first doped portion 132a and the second doped portion 132b, the semiconductor layer 134, source and drain electrodes 141 and 142, the planarization layer 113, the conductive layer 151 and the pixel electrode 152, as explained with reference to FIG. 1. In addition, the OLED display device may include a pixel defining layer 162, spacer 172, an organic emission layer 180, and an opposite electrode 190 on the substrate 110. As noted above, the thin film transistor illustrated in FIG. 2 may be a portion of an OLED display device. The OLED display device may be a top emission type display device or may be a bottom emission type display device. If the OLED display device is a top emission type display device in which an image is displayed at an opposite side of the substrate 110, a material which forms the substrate 110 may not be limited to a transparent material, for example.

In the OLED display device according to the current embodiment, the pixel electrode 152 may act as an anode of the OLED display device, and the opposite electrode 190 may act as a cathode. Alternatively, the pixel electrode 152 may act as a cathode and the opposite electrode 190 may act as an anode. Further, when the OLED display device is a bottom emission type OLED display device in which an image is displayed in the direction toward the substrate 110, the pixel electrode 152 may be a transparent electrode and the opposite electrode 190 may be a reflective electrode. The pixel electrode 152 may be formed of a material having a high work function, such as one or more of ITO, IZO, ZnO and $In_2O_3$, and the opposite electrode 190 may be formed of a material having a low work function, such as one or more of Ag, Mg, Al, Pt, Pd, Au, Ni, Nd, Ir, Cr, Li and Ca.

When the OLED display device according to the current embodiment is a top emission type OLED display device, an image may be displayed in the direction toward the opposite electrode 190. In this example, the pixel electrode 152 may be a reflective electrode, and the opposite electrode 190 may be a transparent electrode. The reflective electrode which is the pixel electrode 152 may be formed by forming a reflective layer, e.g., from one or more of Ag, Mg, Al, Pt, Pd, Au, Ni, Nd, Ir, Cr, Li, Ca or a combination thereof, and then forming a material having a high work function, e.g., one or more of ITO, IZO, ZnO, and $In_2O_3$, thereon. The transparent electrode which is the opposite electrode 190 may be formed by depositing a metal having a low work function, such as one or more of Ag, Mg, Al, Pt, Pd, Au, Ni, Nd, Ir, Cr, Li, Ca, or a combination thereof, and then forming an assistant electrode layer or bus electrode line thereon using a transparent conductive material, such as one or more of ITO, IZO, ZnO and $In2O_3$.

In addition, the surface contact force between the pixel electrode 152 and the planarization layer 113 may be improved by forming the pixel electrode 152 using one or more of ITO, IZO, ZnO and $In_2O_3$, depositing one or more of Ag, Mg, Al, Pt, Pd, Au, Ni, Nd, Ir, Cr, Li, Ca or a combination thereof on the pixel electrode 152, and then forming a material having a high work function, such as one or more of ITO, IZO, ZnO and $In_2O_3$ thereon. Formation of a thin film transistor as well as a device such as an OLED display device will be explained in more detail with reference to FIGS. 3-11.

In embodiments described above, when the pixel electrode 152 includes a single layer, the conductive layer 151 may be simultaneously patterned with the pixel electrode 152. In this example, the conductive layer 151 may be the same material as the pixel electrode 152. In addition, when the conductive layer 151 and the pixel electrode 152 are formed of the same material as the source and drain electrodes 141 and 142, excellent surface properties may be obtained so that a contact resistance between respective electrodes may be decreased.

Alternatively, when the pixel electrode 152 is formed of a double layer or a triple layer (not shown), the conductive layer 151 may be simultaneously patterned with the pixel electrode 152, and may also be formed of a double layer or a triple layer. As one example, the pixel electrode 152 and the conductive layer 151 may be formed of the same material. In addition, a layer in the double layer or triple layer of the pixel electrode 152 and/or the conductive layer 151 may contact the source and/or drain electrodes 141 and 142. If the layer of the pixel electrode 152 and/or the conductive layer 151 is formed of the same material as the source and drain electrodes 141 and 142, excellent surface properties may be realized. For example, contact resistance between the source and drain electrodes 141 and 142 and the conductive layer 151, or the source and drain electrodes 141 and 142 and the pixel electrode 152 may be decreased in at least one embodiment.

Figure 3:
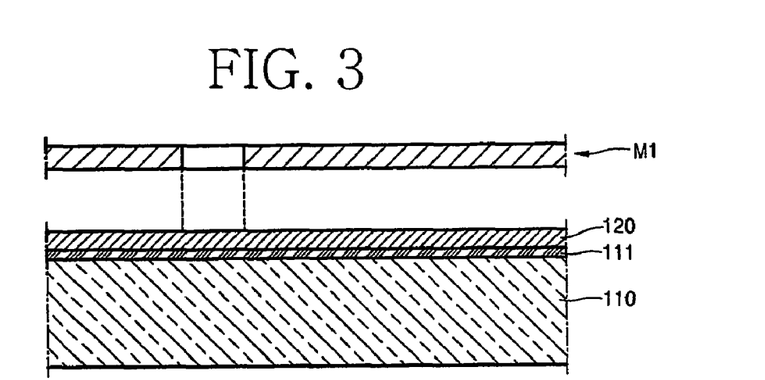
FIG. 3 through FIG. 11 illustrate schematic sectional views of stages of a method of manufacturing a thin film transistor and/or an display device including the thin film transistor according to an embodiment.

Referring to FIGS. 3-11, a method of forming one or more of the embodiments illustrated in FIGS. 1 and 2 is described. In FIG. 3, metal layer 120 including a low-resistance metal, e.g., MoW or Al/Cu, may be deposited on the buffer layer 111. Photoresist may be coated on the entire surface of the metal layer 120 and then patterned to form a mask M1. The photoresist layer (illustrated as mask M1) may be patterned to have a predetermined pattern via a photolithography process, may be baked through an exposing and a developing processes and then may be etched to form mask M1. The etching process may include wet etching or dry etching, for example. The dry etching may include plasma etching, reactive ion etching (RIE), reactive sputter etching or reactive ion beam milling.

Figure 4:
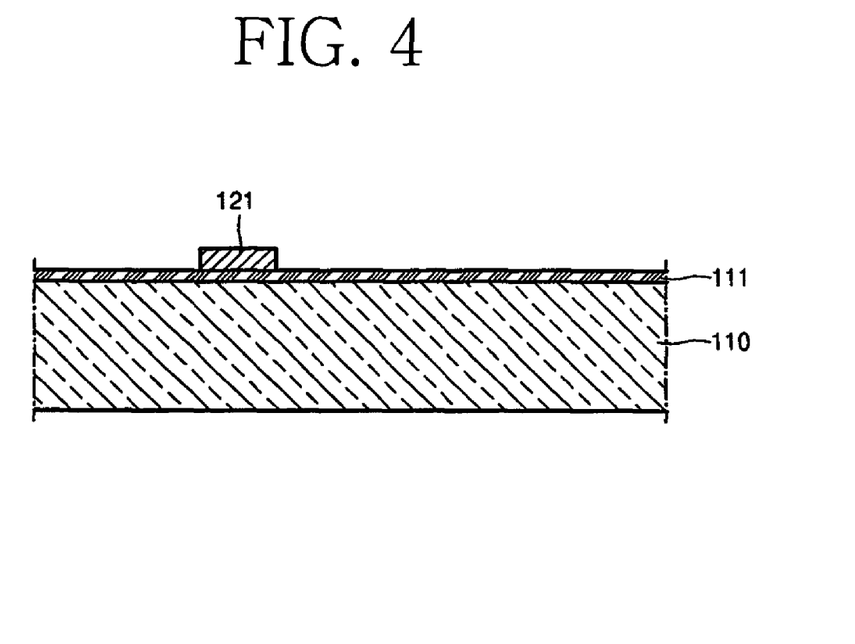

Referring to FIG. 4, the metal layer 120 may be formed into the gate electrode 121 having a predetermined pattern by employing the mask M1. Although not illustrated, the gate electrode 121 may be connected to a gate line that may apply an on/off signal of a thin film transistor.

Figure 5:
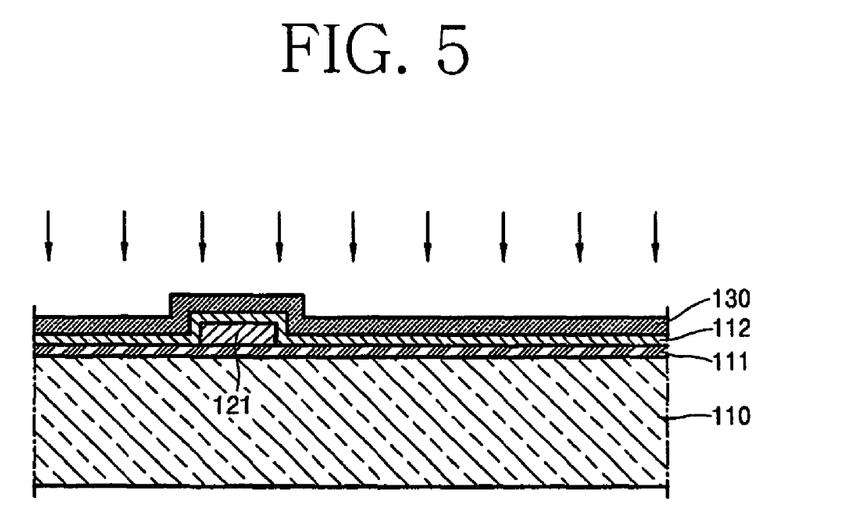

Referring to FIG. 5, the gate insulating layer 112 may be deposited on the gate electrode 121 and the buffer layer 111. The gate insulating layer 112 may be an inorganic insulating layer, e.g., SiNx or SiOx layer deposited by PECVD, APCVD, LPCVD and the like. The semiconductor layer 134

(see FIG. 7) having a predetermined pattern may be formed on the gate insulating layer 112 by employing an amorphous silicon layer 130. The amorphous silicon layer 130 may be deposited and then crystallized. The amorphous silicon layer 130 may be crystallized into a polycrystalline silicon by rapid thermal annealing (RTA), solid phase crystallization (SPC), excimer laser annealing (ELA), metal induced crystallization (MIC), metal induced lateral crystallization (MILC), sequential lateral solidification (SLS) and the like.

Figure 6:
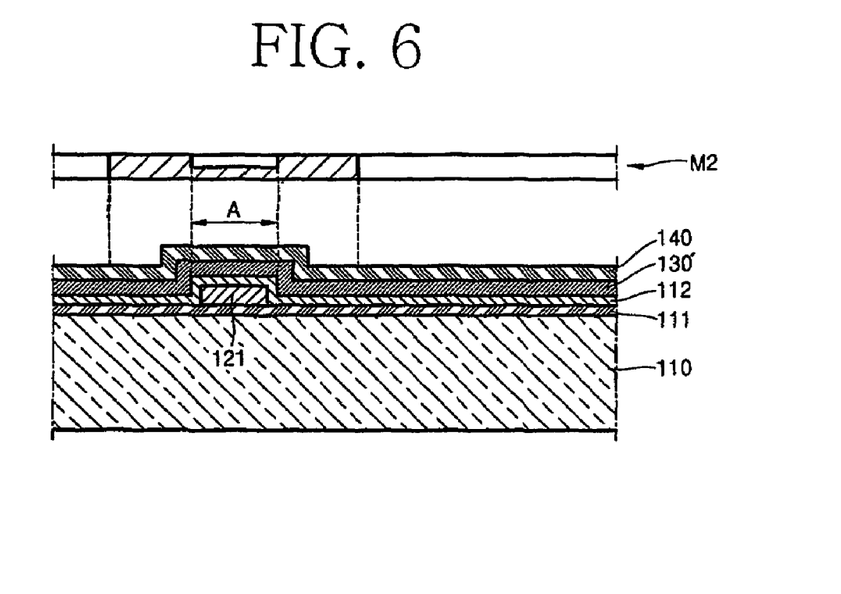

Referring to FIG. 6, the amorphous silicon layer 130 may be crystallized into a polycrystalline silicon to form polycrystalline silicon layer 130'. Prior to patterning polycrystalline silicon layer 130', a conductive material 140 may be deposited on the polycrystalline silicon layer 130'. The conductive material 140 may be a single metal layer formed of Al or Cu, or a double metal layer formed by depositing a metal, such as Mo, W, Cr or Pt on the Al layer, but is not limited thereto. As explained in more detail later, the conductive material 140 may be employed to form source and drain electrodes.

The polycrystalline silicon layer 130' and the conductive material 140 may be sequentially formed on the gate insulating layer 112, for example. The conductive material 140 and the polycrystalline silicon layer 130' may be simultaneously patterned using a single mask M2 having a predetermined pattern including area A to form the semiconductor layer 134, and source and drain electrodes 141 and 142 (refer to FIG. 7.) The mask M2 may include a half-tone mask M2 having a light transmission part, a light blockage part, and a semi-transmission part.

Figure 7:
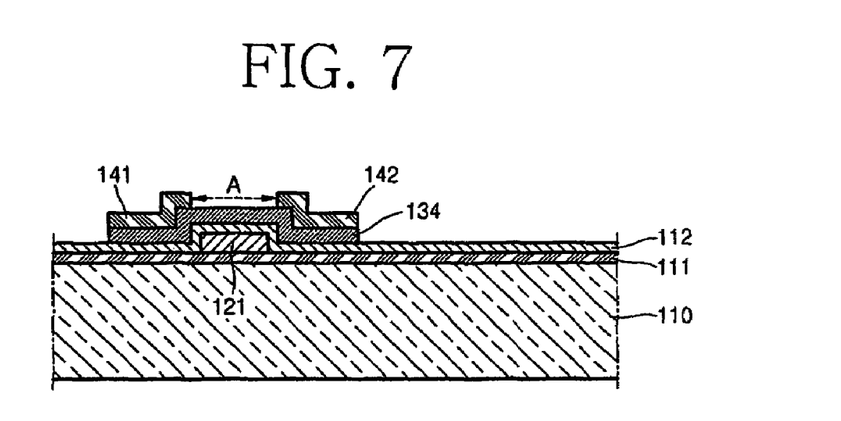

As illustrated in FIG. 7, the mask M2 may be employed to remove a portion of conductive material 140 to form source and drain electrodes 141 and 142, and to remove a portion of polycrystalline silicon layer 130' to form semiconductor layer 134. The mask M2 may further be employed to expose an area A of the semiconductor layer 134 between the source and drain electrodes 141 and 142. As will be explained in more detail later, the exposed area A of the semiconductor layer 134 may include a channel area. Furthermore, end portions of the semiconductor layer 134 and the source and drain electrodes 141 and 142 may have the same pattern via use of the half-tone mask M2. Embodiments of the present invention are not so limited, however. For example, if the half-tone mask M2 is modified, the semiconductor layer 134 and the source and drain electrodes 141 and 142 may have end portions including different patterns.

Figure 8:
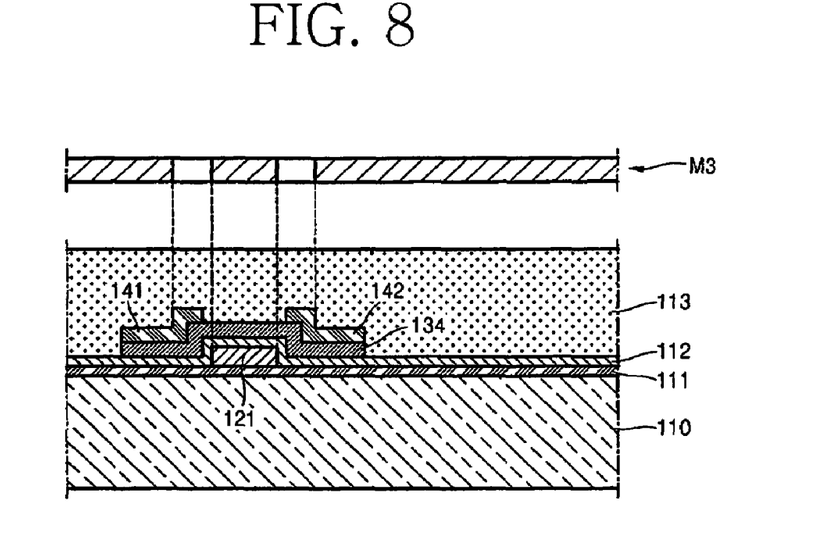

Referring to FIG. 8, the planarization layer 113 may be deposited on one or more of the source and drain electrodes 141 and 142, the semiconductor layer 134 and the gate insulating layer 112. The planarization layer 113 may include an inorganic insulating layer and/or organic insulating layer. The insulating layer may include $SiO_2$, $SiN_x$, $SiON$, $Al_2O_3$, $TiO_2$, $Ta_2O5$, $HfO_2$, $ZrO_2$, BST, PZT, and the like. The organic insulating layer may include a commercially available polymer, such as PMMA or PS, a polymer derivative having a phenol group, an acryl-based polymer, an imide-based polymer, an arylether-based polymer, an amide-based polymer, a fluorine-based polymer, a p-xylene-based polymer, a vinylalcohol-based polymer and a combination thereof and the like. In addition, the planarization layer 113 may be a composite deposition layer of an inorganic insulating layer and an organic insulating layer. After the planarization layer 113 is deposited, a mask M3 having a pattern may be employed to remove portions of the planarization layer 113 to expose portions of area A of the semiconductor layer 134 (see FIG. 7), which includes a sub-portion of the portion of the semiconductor layer 134 exposed via mask M2 (see FIG. 6). Further, portions of the planarization layer 113 may be removed to expose portions of the source and drain electrodes 141 and 142.

Figure 9:
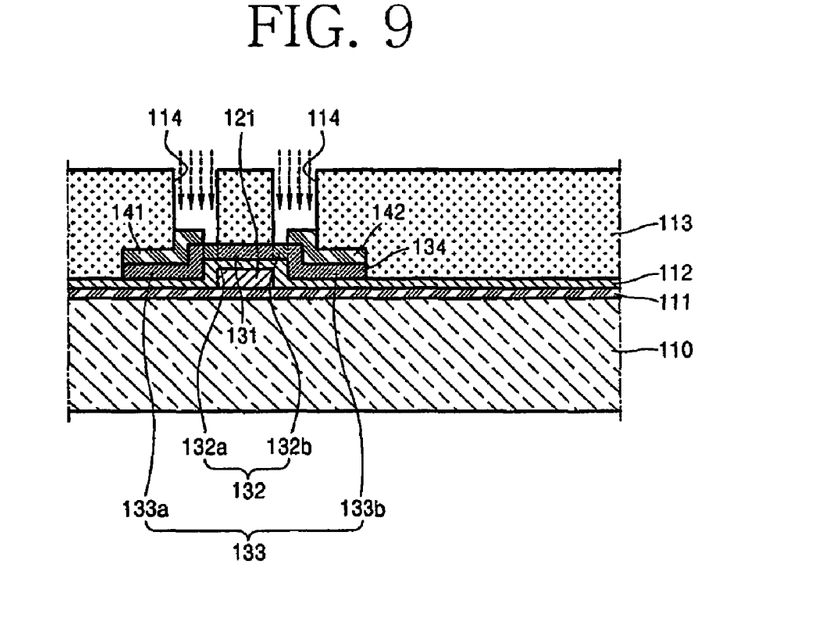

Referring to FIG. 9, a portion of the planarization layer 113 corresponding to area A of semiconductor layer 134 (see FIG. 7) may not be removed. Further, the planarization layer 113 formed on exposed portions of the gate insulating layer 112 and on end portions of the source and drain electrodes 141 and 142 may not be removed. Further, in an additional process step, the remaining planarization layer 113 may be employed to dope the semiconductor layer 134 with an impurity. That is, the semiconductor layer 134 may be doped with an impurity by using the planarization layer 113 without use of an additional mask.

A method of doping the semiconductor layer 134 with an impurity by employing the planarization layer 113 will now be described in detail. Depending at least in part on the use of the thin film transistor resulting from the current processing, the semiconductor layer 134 may be doped with an N-type or P-type impurity by, for example, ion implantation. The N-type thin film transistor may be formed by doping with ionized $PH_3$ gas, and the P-type thin film transistor may be formed by doping with ionized $B_2H_6$ gas. In the current embodiment, the non-etched part of the planarization layer 113 may act as an align mask, such that doping ions are injected only to an opening 114 formed by etching the planarization layer 113. Some of the doping ions injected to the opening 114 may be intercepted by source and drain electrodes 141 and 142, and some of the doping ions are doped to the semiconductor layer 134 formed of the polycrystalline silicon. At this time, a portion of the semiconductor layer 134 exposed by the openings 114 may be doped with an impurity. The doped portion of the semiconductor layer 134 may be formed into a doped area 132 which is doped with an impurity, and an area outside the doped portion of the semiconductor layer 134 may include a non-doped area 133.

When the semiconductor layer 134 and the source and drain electrodes 141 and 142 are simultaneously patterned using the half-tone mask M2 described above, a channel area 131, a non-doped area 133 and a doped area 132 may be formed in semiconductor layer 134. Particularly, the doped area 132 may include a first doped area 132a and a second doped area 132b. The first doped area 132a may be formed between a first non-doped area 133a and the channel area 131. The second doped area 132b may be formed between a second non-doped area 133b and the channel area 131. The first doped area 132a and the second doped area 132b may contact the source electrode 141 and the drain electrode 142, respectively. Alternatively, the first doped area 132a and the second doped area 132b may contact the drain electrode 142 and the source electrode 141, respectively According to embodiments described above, the semiconductor layer 134 and the source and drain electrodes 141 and 142 may be simultaneously patterned. Furthermore, the semiconductor layer 134 may be doped with ions without use of an additional mask, and there is no need to form a contact hole which electrically connects the doped area 132 to the source and drain electrodes 141 and 142. This may result in greatly simplifying the patterning processes relative to conventional processes, for example. The doped area 132 doped with an impurity may, however, insufficiently contact the source and drain electrodes 141 and 142. This may result in the contact resistance between the doped area 132 and the source and drain electrodes 141 and 142 being relatively high, and the operational characteristics of the thin film transistor may deteriorate. This will be explained in greater detail with reference to FIG. 11.

Figure 10:
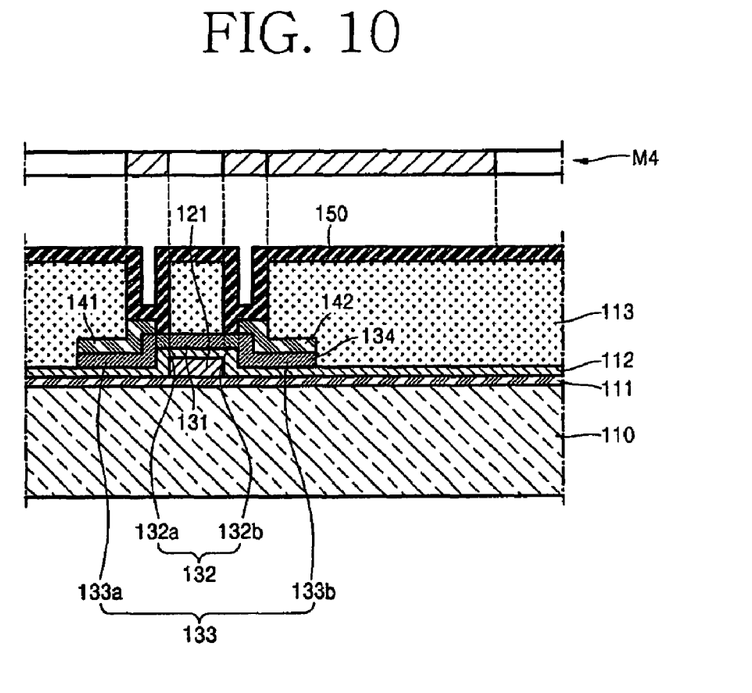

Referring to FIG. 10, a conductive material 150 may be formed on the entire exposed surface of the structure of FIG. 9 described above. After the conductive material 150 is deposited, a mask M4 having a predetermined pattern may be employed to pattern the conductive material 150. Patterning the conductive material 150 may result in conductive material 150 remaining on the first doped area 132a, a portion of the source electrode 141, the second doped area 132b, a portion of the drain electrode 142 and a portion of the planarization layer 113. For example, referring to FIGS. 1 and 11, the conductive material 150 remaining on the first doped area 132a and the part of the source electrode 141 may form the conductive layer 151. The conductive material 150 remaining on the second doped area 132b, a portion of the drain electrode 142, and a portion of the planarization layer may form the pixel electrode 152.

As a result of the patterning using the mask M4, a portion of the thin film transistor illustrated in FIG. 1 may be formed, explained previously. It is worthwhile to note, however, that the resultant structure is not limited to the structure illustrated in FIG. 1, and may vary according to factors including manufacturing conditions, such as a mask work tolerance or the thickness of the conductive material 150. Furthermore, although the particular structure may vary, typically the conductive layer 151 electrically contacts the first doped area 132a and the source electrode 141, the pixel electrode 152 electrically contacts the second doped area 132b and the drain electrode 142, and the conductive layer 151 does not electrically contact the pixel electrode 152.

As described above, a thin film transistor formed according to one or more of the above embodiments may be formed via simplified patterning processes. In addition, by employing a conventional mask process in which the pixel electrode 152 is patterned, the conductive layer 151 and the pixel electrode 152 may contact the doped area 132 and the source and drain electrodes 141 and 142. As a result, an increased contact resistance due to a small contact area between the doped area 132 and the source and drain electrodes 141 and 142 may be reduced and/or prevented.

Figure 11:
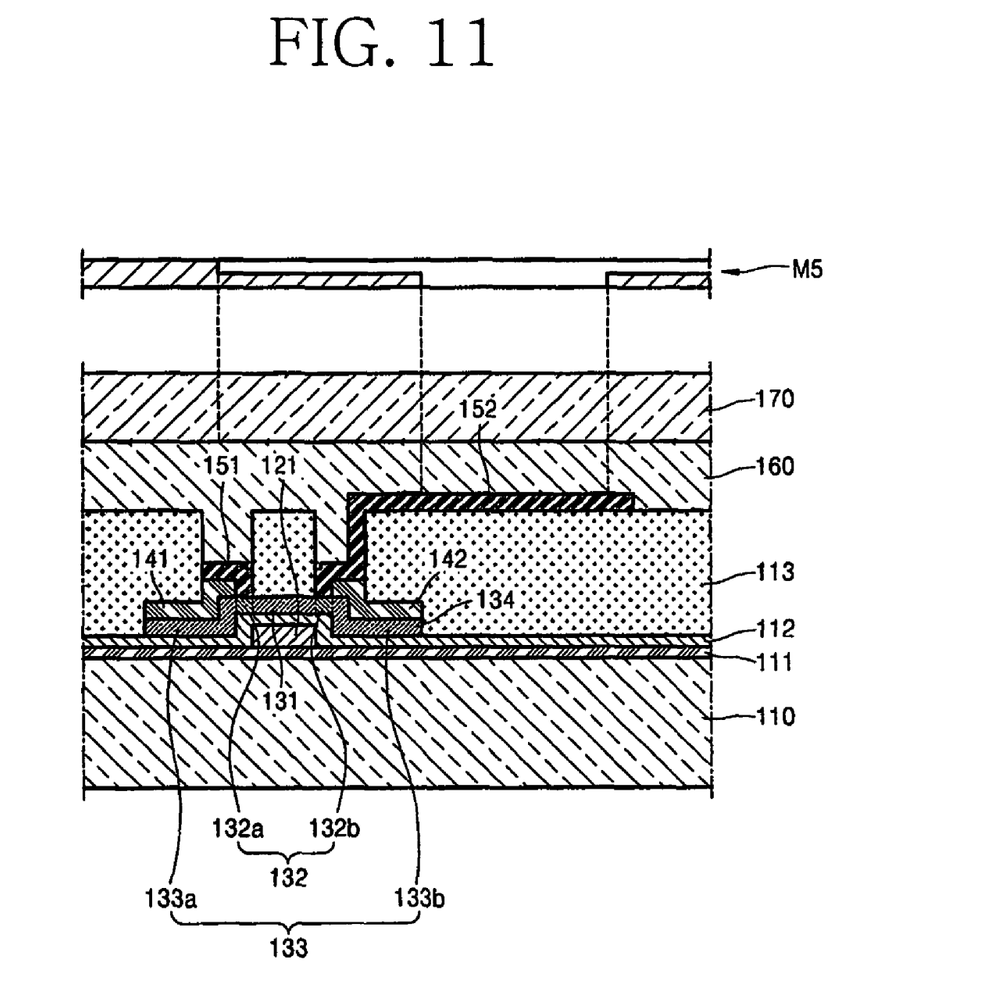

Referring to FIG. 11, a material 162, which may form the pixel defining layer (PDL) 160, may be deposited on one or more portions of the structure illustrated in FIG. 10. In one embodiment, the PDL 160 may be formed of polyimide, although the claimed subject matter is not so limited. The PDL 160 may define an emission area, and may widen an interval between an end part of the pixel electrode 152 and the opposite electrode 190 (see FIG. 2) to prevent formation of a field enhancement phenomenon in the end part of the pixel electrode 152. This may result in reducing and/or preventing a short-circuit between the pixel electrode 152 and the opposite electrode 190.

Before the material 162 is patterned, a spacing material 172, which forms the spacer 170, to protect the organic emission layer 180 (see FIG. 2) from external impacts may be deposited on the material 162. The material 162 and the spacing material 172 may be simultaneously patterned using a mask M5. When the PDL 160 and the spacer 170 are formed to have the same pattern, the mask M5 may be a mask including a light transmission part and a light blockage part. However, when the PDL 160 and the spacer 170 are formed to have different patterns, such as in the present embodiment, the mask M5 may include a half-tone mask which further includes a semi-transmission part.

After the pixel defining layer 160 and the spacer 170 are formed using the mask M5, the organic emission layer 180 (see FIG. 2) may be formed on the resultant structure. The organic emission layer 180 (see FIG. 2) may emit light according to an electrical operation of the pixel electrode 152 and the opposite electrode 190 (see FIG. 2). The organic emission layer 180 (see FIG. 2) may be formed of a low molecular weight organic material or a polymer organic material. When the organic emission layer 180 (see FIG. 2) is formed of a low molecular weight organic material, a hole transport layer, a hole injection layer, and the like are sequentially deposited on the organic emission layer 180 (see FIG. 2) in a direction toward the pixel electrode 152, on the other hand, an electron transport layer, an electron injection layer, and the like are sequentially deposited on the organic emission layer 180 (see FIG. 2) in a direction toward the opposite electrode 190 (see FIG. 2). The usable organic material may include copper phthalocyanine (CuPc), N,N'-Di naphthalene-1-yl-N,N'-diphenyl-benzidine (NPB) and tris-8-hydroxyquinoline aluminum (Alq3).

Referring to FIG. 2, when the organic emission layer 180 is a polymer organic layer formed of a polymer organic material, a hole transport layer (HTL) may be formed on the organic emission layer 180 in a direction toward the pixel electrode 152. The polymer hole transport layer may be formed on the pixel electrode 152 by using poly-2,4-ethylene-dihydroxy thiophene (PEDOT), polyaniline (PANI) and the like through ink-jet printing or spin coating, and a polymer organic emission layer 180 may be formed of PPV, soluble PPV's, cyano-PPV, polyfluorene and the like by ink-jet printing, spin coating or thermal transference using a laser, to have a color pattern. The opposite electrode 190 may be used as a common electrode and may be deposited on the organic emission layer 180, and a sealing member (not shown) that protects the organic emission layer 180 from external moisture or oxygen may be further formed on the opposite electrode 190.

In the organic light emitting display device according to the current embodiment, the semiconductor layer 134 and the source and drain electrodes 141 and 142 may be simultaneously patterned, and the pixel defining layer 160 and the spacer 170 may be simultaneously patterned. As a result, the number of patterning processes using a mask may be significantly decreased. In addition, by using a conventional patterning process in which the pixel electrode 152 is patterned, the conductive layer 151 and the pixel electrode 152 contact the doped area 132 and the source and drain electrode 141 and 142, so that an increase in contact resistance due to a small contact area between the doped area 132 and the source and drain electrodes 141 and 142 may be reduced and/or prevented.

Although the present application discloses an OLED display device, the thin film transistor disclosed in the previous embodiment can be used in various display devices, such as an LCD device, in addition to an OLED display device.

As described above, embodiments may reduce processing requirement in forming a thin film transistor. For example, a semiconductor layer and source and drain electrodes may be simultaneously patterned, deceasing a number of mask processes. Additionally or alternatively, a pixel defining layer and a spacer may be simultaneously patterned, decreasing a number of mask processes. Additionally or alternatively, by using a conventional mask process in which a pixel electrode is patterned, a conductive layer and the pixel electrode contact the source and drain electrodes, so that a contact resistance due to a small contact area between the doped area and the source and drain electrodes may be decreased.

Exemplary embodiments of the present invention have been disclosed herein, and although specific terms are employed, they are used and are to be interpreted in a generic and descriptive sense only and not for purpose of limitation.

Accordingly, it will be understood by those of ordinary skill in the art that various changes in form and details may be made without departing from the spirit and scope of the present invention as set forth in the following claims.

What is claimed is:

1. A thin film transistor (TFT), comprising:
a substrate;
a gate electrode on the substrate;
a gate insulating layer on the gate electrode;
a semiconductor layer on the gate insulating layer, the semiconductor layer including
a top surface;
a channel area aligned in a vertical direction with the gate electrode;
a plurality of doped areas proximate to the channel area; and
a plurality of non-doped areas, each non-doped area proximate to at least one of the plurality of doped areas, the channel area, the plurality of doped areas, and the plurality of non-doped areas forming a continuous layer;
a source electrode on the top surface of the semiconductor layer aligned above one of the plurality of non-doped areas of the semiconductor layer;
a drain electrode the top surface of the semiconductor layer aligned above another one of the plurality of non-doped areas of the semiconductor layer; and
a planarization layer on the gate insulating layer, the source and drain electrodes and the semiconductor layer channel area, the planarization layer including a plurality of openings, each opening exposing at least one of the plurality of doped areas of the semiconductor layer and exposing a portion of at least one of the source electrode and the drain electrode.

2. The TFT as claimed in claim 1, further comprising:
a conductive layer in one of the plurality of planarization layer openings and in contact with at least one of the plurality of doped areas of the semiconductor layer and at least one of the source electrode and the drain electrode; and
a pixel electrode in another one of the plurality of planarization layer openings and extending to a top surface of the planarization layer, the pixel electrode in contact with at least one other of the plurality of doped areas of the semiconductor layer and at least one other of the source electrode and the drain electrode.

3. The TFT as claimed in claim 2, wherein the conductive layer and the pixel electrode are formed of the same material.

4. The TFT as claimed in claim 3, wherein the conductive layer and the pixel electrode are formed of the same material as the source electrode and the drain electrode.

5. The TFT as claimed in claim 1, wherein the semiconductor layer includes a first end portion and a second end portion patterned such that the first end portion and the second end portion of the semiconductor layer are aligned in the vertical direction with an end portion of the source electrode and an end portion of the drain electrode, respectively.

6. The TFT as claimed in claim 1, wherein the semiconductor layer includes a polycrystalline silicon.

7. The TFT as claimed in claim 1, wherein the substrate includes glass.

8. An organic light emitting display device, comprising:
a substrate;
a gate electrode on the substrate;
a gate insulating layer on the gate electrode;
a semiconductor layer on the gate insulating layer, the semiconductor layer including
a top surface;
a channel area aligned in a vertical direction with the gate electrode;
a plurality of doped areas proximate to the channel area; and
a plurality of non-doped areas, each non-doped area proximate to at least one of the plurality of doped areas, the channel area, the plurality of doped areas, and the plurality of non-doped areas forming a continuous layer;
a source electrode on the top surface of the semiconductor layer aligned above one of the plurality of non-doped areas of the semiconductor layer;
a drain electrode the top surface of the semiconductor layer aligned above another one of the plurality of non-doped areas of the semiconductor layer;
a planarization layer on the gate insulating layer, the source and drain electrodes and the semiconductor layer channel area, the planarization layer including a plurality of openings, each opening exposing at least one of the plurality of doped areas of the semiconductor layer and exposing a portion of at least one of the source electrode and the drain electrode;
a conductive layer in one of the plurality of planarization layer openings and in contact with at least one of the plurality of doped areas of the semiconductor layer and at least one of the source electrode and the drain electrode;
a pixel electrode in another one of the plurality of planarization layer openings and extending to a top surface of the planarization layer, the pixel electrode in contact with at least one other of the plurality of doped areas of the semiconductor layer and at least one other of the source electrode and the drain electrode;
a pixel defining layer on the planarization layer and the pixel electrode and exposing a portion of the pixel electrode;
an organic emission layer on the exposed portion of the pixel electrode; and
an opposite electrode on the organic emission layer.

9. The OLED display device as claimed in claim 8, wherein the conductive layer and the pixel electrode are formed of the same material.

10. The OLED display device as claimed in claim 9, wherein the conductive layer and the pixel electrode are formed of the same material as the source electrode and the drain electrode.

11. The OLED display device as claimed in claim 8, wherein the semiconductor layer includes a first end portion and a second end portion patterned such that the first end portion and the second end portion of the semiconductor layer are aligned in the vertical direction with an end portion of the source electrode and an end portion of the drain electrode, respectively.

12. The OLED display device as claimed in claim 8, further comprising a spacer on the pixel defining layer.

13. The OLED display device as claimed in claim 12, wherein the pixel defining layer and the spacer are formed of the same material.

14. The OLED display device as claimed in claim 13, wherein the pixel defining layer and the spacer are formed of a polyimide.

15. The OLED display device as claimed in claim 8, further comprising a buffer layer on the substrate.

16. A method of manufacturing an organic light emitting diode (OLED) display device, the method comprising:
forming a gate electrode on a substrate;

depositing a gate insulating layer on the substrate and the gate electrode;

depositing an amorphous silicon layer on the gate insulating layer;

crystallizing the amorphous silicon layer to form a polycrystalline silicon layer;

depositing a conductive material on the polycrystalline silicon layer;

simultaneously patterning the polycrystalline silicon layer and the conductive material to form a continuous semiconductor layer including a channel area aligned in a vertical direction with the gate electrode, a plurality of doped areas proximate to the channel area, and a plurality of non-doped areas, each non-doped area being proximate to at least one of the plurality of doped areas, from the polycrystalline silicon layer and to form source and drain electrodes from the conductive material, the semiconductor layer having an exposed portion between the source and drain electrodes;

forming a planarization layer on the gate insulating layer, the exposed portion of the semiconductor layer, and the source and drain electrodes; and forming an opening in the planarization layer to expose a sub-portion of the exposed portion of the semiconductor layer and a portion of the source and drain electrodes.

17. The method as claimed in claim 16, further comprising:

doping the exposed sub-portion of the semiconductor layer with an impurity to form a first doped sub-portion and a second doped sub-portion;

depositing a conductive material in the planarization layer opening, on a portion of the planarization layer, on a portion of the source and drain electrodes and on the first and the second doped sub-portions of the semiconductor layer;

patterning a portion of the conductive material deposited in the opening to form a conductive layer in contact with the first doped sub-portion of the semiconductor layer and one of the source and the drain electrode;

patterning another portion of the conductive material to form a pixel electrode in contact with the second doped sub-portion of the semiconductor layer and one other of the source and the drain electrode;

forming a pixel defining layer on the pixel electrode;

patterning the pixel defining layer to expose a portion of the pixel electrode; and forming an organic emission layer and an opposite electrode on the pixel defining layer.

18. The method as claimed in claim 17, further comprising forming a spacer on the pixel defining layer prior to patterning the pixel defining layer.

19. The method as claimed in claim 16, wherein the polycrystalline silicon layer and the conductive material are simultaneously patterned by using a half-tone mask.

20. The method as claimed in claim 18, further comprising simultaneously patterning the pixel defining layer and the spacer by using a half-tone mask.

21. The TFT as claimed in claim 2, wherein:

the conductive layer is directly on the at least one of the plurality of doped areas of the semiconductor layer and the at least one of the source electrode and the drain electrode; and the pixel electrode is directly on the at least one other of the plurality of doped areas of the semiconductor layer and the at least one other of the source electrode and the drain electrode.

* * * * *